(12) United States Patent
Koes

(10) Patent No.: US 9,809,690 B2
(45) Date of Patent: Nov. 7, 2017

(54) CIRCUIT MATERIALS AND ARTICLES FORMED THEREFROM

(71) Applicant: ROGERS CORPORATION, Rogers, CT (US)

(72) Inventor: Thomas A. Koes, Riverside, CA (US)

(73) Assignee: ROGERS CORPORATION, Rogers, CT (US)

( * ) Notice: Subject to any disclaimer, the term of this patent is extended or adjusted under 35 U.S.C. 154(b) by 0 days.

(21) Appl. No.: 15/177,882

(22) Filed: Jun. 9, 2016

(65) Prior Publication Data
US 2016/0362527 A1 Dec. 15, 2016

Related U.S. Application Data

(60) Provisional application No. 62/181,389, filed on Jun. 18, 2015, provisional application No. 62/173,046, filed on Jun. 9, 2015.

(51) Int. Cl.
| | |
|---|---|
| *C08J 5/24* | (2006.01) |
| *H05K 1/03* | (2006.01) |
| *B32B 15/08* | (2006.01) |
| *B32B 15/04* | (2006.01) |
| *B32B 27/06* | (2006.01) |
| *H05K 3/46* | (2006.01) |
| *H05K 1/02* | (2006.01) |

(52) U.S. Cl.
CPC ............. *C08J 5/24* (2013.01); *B32B 15/04* (2013.01); *B32B 15/08* (2013.01); *B32B 27/06* (2013.01); *H05K 1/0373* (2013.01); *B32B 2255/00* (2013.01); *B32B 2255/06* (2013.01); *B32B 2260/00* (2013.01); *B32B 2260/02* (2013.01); *B32B 2260/046* (2013.01); *B32B 2264/00* (2013.01); *B32B 2264/02* (2013.01); *B32B 2307/20* (2013.01); *B32B 2307/204* (2013.01); *B32B 2371/00* (2013.01); *B32B 2457/00* (2013.01); *C08J 2371/00* (2013.01); *C08J 2371/12* (2013.01); *C08J 2479/04* (2013.01); *H05K 1/024* (2013.01); *H05K 3/4626* (2013.01); *H05K 2201/0212* (2013.01)

(58) Field of Classification Search
CPC ...... C08J 5/24; C08J 2479/04; C08J 2371/12; B32B 15/08; B32B 27/00; B32B 15/00; B32B 15/04; B32B 27/06; B32B 2307/20; B32B 2255/06; B32B 2264/02; B32B 2307/204; B32B 2371/00; B32B 2457/00; B32B 2255/00; B32B 2260/00; B32B 2260/02; B32B 2264/00; H05K 1/0231; H05K 1/0366; H05K 3/4602; H05K 1/0373

See application file for complete search history.

(56) References Cited

U.S. PATENT DOCUMENTS

| | | | |
|---|---|---|---|
| 3,576,789 A | 4/1971 | Kochhar | |
| 4,587,162 A | 5/1986 | Nagai et al. | |
| 4,962,168 A | 10/1990 | Hiratsuna et al. | |
| 5,486,941 A * | 1/1996 | Saiuchi et al. ...... | G02F 1/13392 349/149 |
| 6,254,971 B1 | 7/2001 | Katayose et al. | |
| 6,445,504 B1 * | 9/2002 | Suga et al. ........... | G02B 5/0215 349/64 |
| 6,734,259 B1 | 5/2004 | Japp et al. | |
| 7,138,470 B2 | 11/2006 | Fukushi et al. | |
| 7,148,300 B2 | 12/2006 | Fukushi et al. | |
| 2004/0132925 A1 | 7/2004 | Saitou et al. | |
| 2009/0323300 A1 | 12/2009 | Fujimoto et al. | |
| 2010/0091374 A1* | 4/2010 | Iwata et al. ............ | G02B 1/111 359/599 |
| 2012/0045955 A1 | 2/2012 | Boday et al. | |
| 2012/0164452 A1 | 6/2012 | Jordi et al. | |
| 2013/0109790 A1 | 5/2013 | Fukushi et al. | |
| 2013/0334477 A1 | 12/2013 | Taketani et al. | |
| 2015/0105505 A1 | 4/2015 | He et al. | |

FOREIGN PATENT DOCUMENTS

JP 2003138132 5/2003

OTHER PUBLICATIONS

International Search Report for PCT/US2016/036648 dated Aug. 26, 2016, 5 pages.
Written Opinion of the International Search Report for PCT/US2016/036648 dated Aug. 26, 2016, 6 pages.

* cited by examiner

*Primary Examiner* — Nathan M Nutter
(74) *Attorney, Agent, or Firm* — Cantor Colburn LLP

(57) ABSTRACT

Disclosed is a circuit material, including dielectric substrate or a circuit subassembly further comprising a conductive layer, that is formed from a precursor composition, wherein the precursor composition comprises, based on the total weight of the precursor composition, thermosetting resin or thermoplastic polymer, optionally monomeric triallyl isocyanurate or triallyl cyanurate, dispersed particles of poly(triallyl isocyanurate) or poly(triallyl cyanurate), and optionally inorganic filler, wherein the circuit material has a $D_f$ of less than 0.0060 at 10 GHz. Also disclosed is a method of manufacturing such a circuit material in which emulsion polymerized particles of poly(triallyl isocyanurate) or poly(triallyl cyanurate) are dispersed in a thermosetting or thermoplastic resin.

25 Claims, 2 Drawing Sheets

CIRCUIT MATERIALS AND ARTICLES FORMED THEREFROM

BACKGROUND

This invention generally relates to circuit materials, methods of manufacture of the circuit materials, and articles formed therefrom, including circuits and multilayer circuits.

As used herein, a circuit material is an article used in the manufacture of circuits and multilayer circuits, and includes circuit subassemblies, non-clad or declad dielectric layers, single or double clad dielectric layers, prepregs, build-up materials, bond plies, resin-coated conductive layers, cover films, and the like. A circuit laminate is a type of circuit subassembly that has a conductive layer, e.g., copper, fixedly attached to a dielectric substrate layer. Double clad laminates have two conductive layers, one on each side of the dielectric layer. Patterning a conductive layer of a laminate, for example by etching, provides a circuit. Multilayer circuits comprise a plurality of conductive layers, at least one of which contains a conductive wiring pattern. Typically, multilayer circuits are formed by laminating two or more materials in proper alignment together, at least one of which contains a circuit layer, using bond plies, while applying heat or pressure.

Dielectric layers include "prepregs," typically comprising a fibrous reinforcement that is impregnated with a resin system that is partially cured ("B-staged"). A prepreg can also be referred to as a bonding sheet. Thus, a prepreg can be B-staged to obtain an intermediate stage in the reaction of the thermosetting resin used in the material, after being held at an elevated temperature for a sufficient time to volatilize formulation solvent. After B-staging, the prepreg can be stored for an extended period of time prior to fully curing the material during the manufacture of a circuit laminate or other circuit subassembly. In one type of construction, multilayer laminates can comprise two or more plies of prepregs between metal layers.

In the art of circuit laminates, preferred dielectric materials for use in the manufacture of substrates, bond plies, and the like are characterized by lower dissipation factors ($D_f$), especially for high performance circuit applications, for example, operating at high frequency or at high data transfer rates. $D_f$ is a measure of loss-rate of energy of an electrical oscillation in a dissipative system. Electrical potential energy is dissipated to some extent in all dielectric materials, usually in the form of heat, and $D_f$ can vary depending on the dielectric material and the frequency of the electrical signals. $D_f$ can be especially relevant to a printed circuit board (PCB) antenna, a critical component in any transmission system or wireless communication infrastructure, for example, cellular base station antennas. For high performance applications, a dielectric constant ($D_k$) of less than 3.5 and a $D_f$ of less than 0.006 are desirable.

In addition to low dissipation factor, another consideration in the selection of material components for high performance electronic applications is low flammability. Low flammability can be difficult to achieve because the lower polarity polymers preferred for lowering $D_f$ can also exhibit greater flammability, resulting in the need for flame retardant additives in circuit materials. The selection and amount of flame retardant, however, may need to be limited in order to avoid adversely affecting electrical properties, thermal stability, water absorption, chemical resistance, and other properties such as peel strength.

Still other properties of interest for high performance circuit materials are high Tg, for heat resistance, and low coefficient of thermal expansion (X, Y, Z CTE) for dimensional stability and plated-through-hole (PTH) reliability.

Improving one property of a circuit material, however, can adversely affect another property of the circuit material. Thus, for example, a higher Tg material may be at the expense of a lower Df, so that obtaining a desired matrix of properties can be a challenge in developing an improved circuit material.

Moreover, not only do the electrical and physical properties of the final product need to be considered, but so do the properties of the formulation used to manufacture the final product. Thus, another consideration in the selection of a component material used in the manufacture of a high performance circuit material is its impact during the manufacture of the circuit material. In particular, there is a need to curtail or limit polymer or prepolymer flow to prevent runback during prepreg manufacture. Also, during lamination, when a prepreg is typically heated under pressure, the polymer or prepolymer melts (liquefies) and flows. The prepreg polymer or prepolymer content, pressure, and the rate of heating of the system can impact the amount of flow that occurs during lamination. There is a finite period of time during which the polymer or prepolymer remains sufficiently fluid to flow freely, after which, if curing is used, the average molecular weight increases to the point at which it becomes solidified or "gelled." A certain amount of flow of the polymer or prepolymer is desirable in the lamination process and can impact such properties as interlaminar bond, fill and flow into patterned features of adjacent layers, bonding to copper foil and final dielectric thickness ($H_f$). Thus, the viscosity or flow characteristics of a prepreg, both during manufacture and during subsequent lamination, can be important for obtaining good manufacturing performance.

In order to more efficiently cure a thermosetting resin system of a circuit material during manufacture and subsequent processing, such as lamination, a crosslinking agent can be employed to react with the thermosetting resin. Common crosslinking agents are triallyl isocyanurate (TAIC) and triallyl cyanurate (TAC), typically in monomeric liquid form. Although capable of providing high cross-link density, the use of monomeric triallyl isocyanurate monomer can cause runback against the glass or other fabric reinforcement. Moreover, triallyl isocyanurate monomer can be fugitive in treater equipment, depending upon the B-staging or other conditions used to manufacture a prepreg.

U.S. Pat. No. 3,576,789 discloses poly(TAIC) in powder form and a particle size of less than five microns, preferably less than one micron, which powder can be prepared by emulsion or suspension polymerization. The patent mentions blending such particles with polypropylene or other polyolefin above the melting point of the polyolefin. Crosslinking of other polymers is not mentioned.

U.S. Pat. No. 4,962,168 and U.S. Patent Publication 2013/0334477 disclose the polymerization of TAIC monomer in the presence of an oxaphosphorine flame retardant (9,10-dihydro-9-oxa-10-phosphaphenanthrene-10-oxide or "DOPO"). Specifically, the patent mentions TAIC "prepolymers" of low molecular weight, although mentioning a broad range of 800 to 80,000 and noting that a molecular weight of 20,000 to 80,000 tends to give a powder. The examples in the patent, however, obtained a molecular weight ranging from 1,180 to 27,480, as measured by GPC. As background information, the patent mentions that possible uses of TAIC in general include electronic materials, synthetic resins, paints, adhesives, and other industrial materials, although. The examples in the patent, however, are directed to impregnating a laminate paper. Again, crosslinking of other polymers is not mentioned.

U.S. Pat. No. 6,254,971 discloses (Example 7) a circuit material comprising both poly(TAIC) and monomeric TAIC, wherein the poly(TAIC) is the basic resin. Other examples in the patent include resin systems based on poly(phenylene ether) or PPE, but there is no example of a mixture of PPE and poly(TAIC) or of poly(TAIC) dispersed in a matrix polymer system.

U.S. Pat. No. 6,734,259 and Patent Publication 2012/0045955 disclose prepreg circuit materials comprising a combination of PPE, TAIC, and silica, but not poly(TAIC). Finally, Patent Publication 2012/0164452 discloses poly (TAIC) in the form of microbeads (1 to 100 microns in diameter) for use in HPLC. U.S. Patent Publication 2015/0105505 discloses a reactive trimer of dibromostyrene and dibromostyrene in a varnish composition for making a prepreg.

U.S. Pat. No. 7,138,470, U.S. Patent Publication 2013/0334477, and related patents disclose the possible use of poly(triallyl isocyanurate) or the like as co-agents in the vulcanization of fluoroelastomers.

In view of the above, there remains a need for improved high performance circuit materials comprising precursor compositions, especially low polarity compositions, for use in a circuit material. Specifically, there is a need for circuit materials having an improved combination of properties, including high $T_g$ and low $D_f$, among other desired electrical and physical properties. Furthermore, such circuit materials, even when containing significant amounts of monomeric TAIC for crosslinking, are desirably capable of being efficiently manufactured and of providing low flammability during use.

SUMMARY

The above-described drawbacks and disadvantages are alleviated by a circuit material comprising comprising a dielectric layer comprising a polymer component, wherein the polymer component comprises: a continuous polymeric matrix; and particles comprising a poly(triallyl isocyanurate), a poly(triallyl cyanurate), a copolymer comprising at least one of the foregoing, or a combination comprising at least one of the foregoing, wherein the particles are dispersed in the continuous polymeric matrix; and wherein the circuit material has a $D_f$ of less than 0.0060 at 10 GHz, preferably less than 0.0040 at 10 GHz, more preferably less than 0.0030 at 10 GHz, and a $D_k$ of less than 3.8 at 10 GHz.

Also disclosed is a dielectric layer comprising a polymer component, wherein the polymer component comprises: a continuous polymeric matrix; and particles comprising a poly(triallyl isocyanurate), a poly(triallyl cyanurate), a copolymer comprising at least one of the foregoing, or a combination comprising at least one of the foregoing, wherein the particles are dispersed in the continuous polymeric matrix; and optionally, monomeric triallyl isocyanurate, monomeric triallyl cyanurate, or a combination comprising at least one of the foregoing.

Yet another aspect is directed to a method of making a circuit material comprising combining a thermoplastic polymer, a thermosetting resin, or a combination comprising at least one of the foregoing with a plurality of polymer particles comprising poly(triallyl isocyanurate), poly(triallyl cyanurate), a copolymer comprising at least one of the foregoing, or a combination comprising at least one of the foregoing, and having decomposition temperature greater than 400° C., to provide a precursor composition; and forming the precursor composition into a dielectric layer.

Still other aspects are directed to a printed wiring board or other circuit subassembly formed from the above-described circuit materials and to a method for the manufacture of such circuit subassemblies. In particular, a circuit subassembly comprises a conductive metal layer; and the above-described dielectric layer, wherein a peel strength between the conductive metal layer and the dielectric layer is greater than 4.0 pounds per inch.

The disclosure is further illustrated by the following drawings, detailed description, and examples.

BRIEF DESCRIPTION OF THE DRAWINGS

Referring now to the exemplary drawings wherein like elements are numbered alike in the figure.

DETAILED DESCRIPTION

Figure 1:
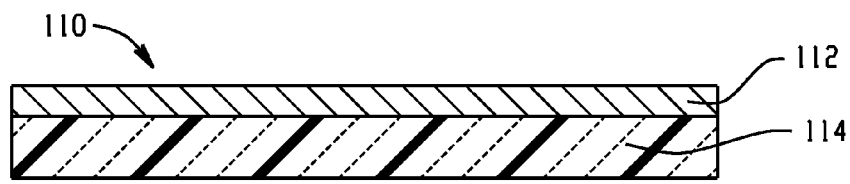
FIG. 1 is a schematic of a single clad laminate.

As will be described in greater detail in the examples below, it was unexpectedly found that improved circuit materials, especially for high frequency applications, can be obtained by using poly(TAIC) or poly (TAC), optionally in combination with monomeric TAIC or TAC, in the polymeric component of dielectric materials. As used herein TAIC refers to triallyl isocyanurate (1) and TAC refers to triallyl cyanurate (2),

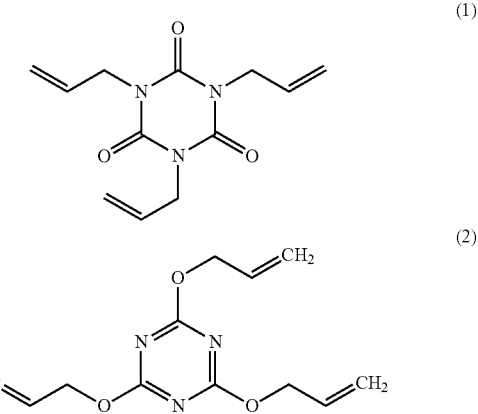

collectively referred to as TAIC/TAC, i.e., triallyl isocyanurate or triallyl cyanurate. Similarly, poly(TAIC/TAC) refers to homopolymers and copolymers comprising triallyl isocyanurate repeat units or triallyl cyanurate repeat units. Specifically, the polymer component of the dielectric material comprises a continuous polymer matrix containing dispersed particles of poly(TAIC/TAC). The particles of poly (TAIC/TAC) can be obtained by emulsion polymerization.

The presence of the poly(TAIC/TAC) in the polymer component allows the incorporation of TAIC or TAC moieties (as repeat units) in the circuit material, which can have positive effects on the electronic and other properties of the circuit material, as further described below. Moreover, the presence of poly(TAIC/TAC) allows a higher amount of cyanurate unit content than possible with the use of TAIC/TAC monomer alone. The terms "isocyanurate unit content" and "cyanurate unit content" refer, respectively, to the content of cyclic structural units (3) and (4) below, which are constitutional isomers (tautomers) of each other, comprising nitrogen, carbon and oxygen atoms, contained within TAIC/TAC monomer or poly(TAIC/TAC), including oligomers of poly(TAIC/TAC).

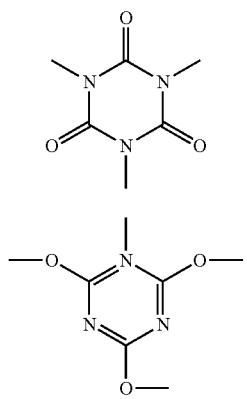

More specifically, the presence of the poly(TAIC/TAC) particles in the formulations used to manufacture the circuit materials was found to unexpectedly result in an improved balance of properties in the dielectric material, particularly electrical properties for high frequency circuit applications, including a lower dissipation factor ($D_f$) of less than 0.0060, preferably less than 0.0040, more preferably equal to or less than 0.0030, most preferably from 0.0010 to 0.0040, each measured at 10 GHz. In some embodiments, the circuit subassembly exhibits a dissipation factor of 0.0010 to 0.0035, or 0.0010 to 0.0030, or 0.0025 to 0.0035, each measured at 10 GHz, and a dielectric constant ($D_k$) of 2.5 to 3.5.

Advantageous features of poly(TAIC/TAC) can include one or more of the following: (1) it is non-reactive or relatively less reactive compared to monomeric TAIC/TAC; (2) its density is comparable to most polymers; (3) it is virtually insoluble in typical solvents and, hence, has minimal impact on solution viscosity; (4) it is a low $D_f$ and high $T_g$ polymer; (5) it has a relatively low CTE; (6) it has a high temperature of decomposition ($T_d$); (7) it has a low Mohs hardness; (8) it is inherently less flammable than many base polymers used in low loss circuit materials; and (9) it acts as a modifier for polymer and prepolymer rheology control, i.e., it can serve as a flow restrictor during manufacture.

Preferably, regarding electrical properties, dielectric substrate layers, as disclosed herein, or circuit subassemblies made therefrom, can have a $D_f$ of less than 0.0060 at 10 GHz, preferably less than 0.0030 at 10 GHz; and a $D_k$ of less than 3.8 at 10 GHz, preferably less than 3.30 at 10 GHz. As indicated above, $D_f$ is a measure of loss-rate of electrical potential energy in a dielectric material, usually in the form of heat, and determines the "lossiness" of a material. A low dielectric loss is desired for high-speed interconnects and operation at high frequencies in a printed circuit assembly.

Furthermore, as a rheology modifier, poly(TAIC/TAC) allows a higher amount of TAIC/TAC monomer, used for crosslinking, to be present in the circuit material than otherwise without adversely affecting the manufacturing process. In particular, the use of the poly(TAIC/TAC) particles allows increased amounts of TAIC/TAC monomer (triallyl isocyanurate or triallyl cyanurate) in a formulation for a circuit material by curtailing or decreasing prepreg polymer or prepolymer flow (resin runback) otherwise associated with those levels of TAIC/TAC. At the same time, the presence of the poly(TAIC/TAC) particles, because they have limited or no solubility in solvent, do not unduly or adversely increase viscosity of the formulation during prepreg manufacture or o the prepreg later during lamination.

Without wishing to be bound by theory, poly(TAIC/TAC) particles are believed to contain some residual or unreacted unsaturated groups but, due to steric hindrance, they may not be reactive or may have more limited reactivity. Some residual crosslinking functionality in the particles may become available, however, to react with the thermosetting polymer in continuous polymeric matrix, including interpenetrating networks, particularly at elevated temperatures that can occur during manufacture of the dielectric layer or prepreg.

In some embodiments, the use of poly(TAIC/TAC) particles in circuit materials particles was found to allow the use of relatively less inorganic filler, for example fused silica. In some embodiments, therefore, poly(TAIC/TAC) particles can be viewed as an "organic filler" that can be used to partially replace inorganic filler such as silica. This can be accomplished without adversely affecting the $D_f$, or even decreasing $D_f$.

As an alternative, or partial or complete replacement, to many ceramic fillers, poly(TAIC/TAC) is lighter and softer. Particles of poly(TAIC/TAC) can exhibit lower density and lower Mohs hardness relative to many inorganic fillers. Although inorganic fillers can be useful for modifying formulation rheology (flow, thixotropy), inorganic fillers are often quite dense, and thus tend to settle, as well as hard, rendering tooling, for example, drilling difficult to accomplish. An organic filler such as poly(TAIC/TAC) not only can provide more flexible and lighter circuit materials, preferably materials of lower modulus, compared to the use of inorganic fillers.

Still another advantage of poly(TAIC/TAC) is that it can act as a nitrogen synergist for halogen-free flame retardants used in the circuit materials, preferably for phosphorus-containing flame retardants, more preferably phosphinates and aromatic phosphorus-containing organic flame retardants, for example, phosphazenes.

Particles of poly(TAIC/TAC) can be efficiently prepared by emulsion polymerization, suspension polymerization, or dispersion polymerization for use as an additive in compositions to form high performance electronic materials. Specifically, emulsion polymerization is a type of radical polymerization that can start with an emulsion incorporating water, monomer, and surfactant, for example, sodium dodecyl sulfate among other possible surfactants, as will be appreciated by one skilled in the art. The polymerized particles are prevented from coagulating with each other because each particle is surrounded by the surfactant, and the polarity of the surfactant repels other particles electrostatically. Thus, emulsion polymerization can involve an inhomogeneous system, resulting in particles of colloidal dimensions containing the formed polymer. The emulsion polymerized particles are insoluble in the aqueous medium and, hence, are filterable using a filter. The product of emulsion polymerization can be washed to remove surfactants and dried to remove water prior to mixture with a base resin. In a preferred embodiment, the particles are washed with an aqueous basic solution, for example an aqueous solution of an alkali or alkaline earth metal base, such as sodium carbonate, potassium hydroxide, or the like. Without being bound be theory, it is believed that this wash removes ions such as sulfate ions that can adversely affect properties such as $D_f$.

Specifically, in some embodiments, the particles of poly (TAIC) can be made by emulsion polymerization, in which fine droplets of TAIC monomer are polymerized in the presence of an initiator such as ammonium persulfate in an aqueous medium containing the surfactant as an emulsifier, and then washed with a basic KOH solution.

Emulsion polymerization factors can include: (1) mechanical agitation, (2) use of a surfactant to emulsify the monomer, and (3) one primary aqueous phase. In contrast, suspension polymerization factors can include: (1) mechanical agitation, (2) the volume ratio of aqueous to organic phases, and (3) the addition of a stabilizing agent to establish a stable suspension of monomer droplets. Dispersion polymerization is a type of precipitation polymerization, meaning the solvent selected as the reaction medium is a good solvent for the monomer and the initiator, but is a non-solvent for the polymer. The selection of emulsion polymerization, suspension polymerization, or dispersion polymerization can depend on the desired particle size. In one specific embodiment, the polymer particles are 0.005 to 15 micrometers (μm) in median particle size, preferably 0.1 to 5 μm, most preferably 0.5 to 1.5 μm in mean particle size, as determined by dynamic light scattering. The poly(TAIC/TAC) particles can comprise oligomers or polymers.

The poly(TAIC/TAC) can comprise less than 30 wt. %, preferably less than 20 wt. %, more preferably less than 10 wt. % of comonomers, based on the total weight of the monomers. Copolymers of TAIC/TAC can include but are not limited, for example, reaction of TAIC/TAC with a minor amount of aliphatic aldehydes such as acetaldehyde, n-butyraldehyde, isobutyraldehyde, propionaldehyde, n-valeric aldehyde, isovaleric aldehyde, n-caproic aldehyde, 2-ethyl-butyraldehyde, n-caprylic aldehyde, 2-ethyl-caproic aldehyde, cyclohexyl aldehyde, or the like, as described for example in GB Patent No. 1341000. Other possible comonomers are ethylenically unsaturated monomers such as vinyl acetate, methyl acrylate, methyl methacrylate, diallyl phthalate, styrene, acrylonitrile, or a combination comprising at least one of the foregoing. The poly(TAIC/TAC) can also include copolymerization with other vinyl materials, for example, trivinyl cyclohexane (TVCH) or, in order to incorporate phenolic functionality, diallylbisphenol A (DABPA) or the like. Optionally, poly(TAIC) can also be modified with a flame retardant such as DOPO in an amount of 5 to 150 wt. % based on the weight of the TAIC in the poly (TAIC), as disclosed in U.S. Pat. No. 4,962,168.

The composition used to form dielectric layers for a circuit material can include a thermosetting resin, or a thermoplastic polymer, or both, to provide the continuous polymer matrix, and is referred to herein for convenience as "the precursor composition". The thermosetting resin, thermoplastic polymer, or both can be low polarity (which is inclusive of non-polar). Accordingly, substantial amounts of epoxy-containing and polyimide-containing resins can be excluded. Preferably, any epoxy-containing or polyimide-containing resins are present in the precursor composition in an amount less than 10 wt. %, more preferably less than 5 wt. %, based on the total weight of the polymer or prepolymer, and most preferably is essentially absent.

More preferably, the thermosetting resin, thermoplastic polymer, or both used to prepare the dielectric layer can be a low polarity, low dielectric constant, and low loss material. The precursor composition can include thermosetting resin, thermoplastic polymer, or both, that has an LOI (limiting oxygen index) of less than 20. In an embodiment the precursor composition comprises a thermosetting resin that has an LOI of less than 20 and comprises at least two (preferably, on average, two or more) free-radically reactive functional groups, preferably groups having an ethylenically unsaturated double bond, and can further comprise at least one flame retardant. Such materials can be unduly flammable unless formulated with flame retardant additives. In some embodiments, the precursor composition can have a combined bromine and chlorine content of less than 900 ppm, which is considered essentially halogen free, while not unduly affecting electrical or other properties.

In some embodiments, the circuit material comprises a polymer having a $T_g$ greater than 170° C., preferably greater than 200° C., a $T_d$ greater than 350° C., preferably greater than 400° C., and is formed from a thermosetting resin having an LOT of less than 20 and that comprises at least two free-radically reactive functional groups. The circuit material, inclusive of flame retardant, can have a UL-94 rating of at least V-1, preferably V-0; a $D_f$ of less than 0.0060 at 10 GHz, preferably less than 0.0030 at 10 GHz, or from 0.0010 to 0.0060 at 10 GHz, preferably from 0.0010 to 0.0030 at 10 GHz; and a $D_k$ of less than 3.8 at 10 GHz, preferably less than 3.30 at 10 GHz.

As mentioned above, one of the potential advantages of the present composition is that the poly(TAIC/TAC) can act as a synergist for a flame retardant, preferably a synergist for a halogen-free flame retardant, more preferably a phosphorus-containing flame retardant, most preferably an aromatic phosphorus-containing flame retardant, most preferably an oxaphosphorinoxide-containing aromatic compound such as DOPO (9,10-dihydro-9-oxa-10-phosphaphenanthrene 10-oxide) or DOPO derivatives, including its dimer or other oligomer. In some embodiments, the precursor composition can have a weight ratio of oxaphosphorinoxide-containing aromatic compound to combined TAIC/TAC monomer, if any, and poly(TAIC/TAC) that is greater than 3:1, preferably greater than 5:1.

Poly(TAIC/TAC) can be used in a precursor composition in an amount of 1 to 40 weight percent (wt. %), preferably 2 to 30 wt. %, more preferably 3 to 25 wt. %, most preferably 5 to 22 wt. %, based on the total weight of the thermosetting or thermoplastic precursor composition. By the term "total weight of resin" is meant weight of components that are in polymer or prepolymer form in the precursor composition for a final dielectric substrate, including the polymer particles, crosslinkers, and reactive monomers, and not including inorganic materials.

In some embodiments, TAIC/TAC monomer is also used, in an amount of 1 to 50 wt. %, preferably 5 to 40 wt. %, more preferably 10 to 35 wt. %, most preferably 15 to 30 wt. %, based on the total weight of a precursor composition. In some embodiments, the ratio of TAIC/TAC monomer to poly(TAIC/TAC) is 0.2:1 to 1.5:1, for example, but can depend on the particular formulation of the precursor composition.

With or without the TAIC/TAC monomer, the total cyanurate unit content of the precursor composition can be at least 12 wt. %, preferably 15 to 25 wt. %, based on the total weight of the precursor composition. In these embodiments, the circuit material can have a $D_f$ of less than 0.0040 at 10 GHz, for example 0.0010 to less than 0.0040 at 10 GHz. In a specific embodiment, the poly(TAIC/TAC) is present in the precursor composition in an amount of 1 to 50 wt. %, and the TAIC/TAC monomer is present in the precursor composition in an amount from 1 to 50 wt. %, and the circuit material can have a $D_f$ of less than 0.0040 at 10 GHz, for example 0.0010 to less than 0.0040 at 10 GHz.

Examples of precursor compositions, in particular thermosetting compositions, include those based on, or containing substantial amounts of thermosetting resins (greater than 15 wt. % of the total resin, preferably greater than 25 wt. % of total resin, most preferably greater than 50 wt. % of total resin). Such thermosetting resins can include, for example, 1,2-polybutadiene, polyisoprene, polybutadiene-polyisoprene copolymers, polybutadiene-polystyrene-polydivinylbenzene terpolymers, poly(phenylene ether) resins, curable cyclic olefins or their copolymers (such as the copolymers described in US patent publications 2008/0259234 and 2011/0060096), and combinations comprising at least one of the foregoing resins. The thermosetting resin can be functionalized with a reactant compound to contain ethylenically unsaturated double bonds. For example, the thermosetting resin can be vinylated, allylated, acrylated, methacrylated, or maleinated to comprise free-radically reactive ethylenically unsaturated double bonds. In some embodiments, the thermosetting composition is based on a vinyl-functional polybutadiene or a vinyl, methacrylate or allyl-functional poly(phenylene ether). The vinyl, acrylate, methacrylate, or allyl-functional poly(phenylene ether) can have a number average molecular weight of less than 4,000 Da. Such low molecular weight vinyl, methacrylate or allyl functional poly(phenylene ether) resins are commercially available from Mitsubishi Gas under the trade name of MGC OPE-2St, from Sabic Innovative Plastics under the trade names SA9000 and SA5587, Xyron®-modified polyphenylene ether polymers from Asahi Kasei. Such vinyl-functional polybutadiene resins are commercially available from Nisso America, Inc. under the trade names B3000, B2000 and B1000, and from Cray Valley Hydrocarbon Specialty Chemicals under the trade name Ricon®. Still other co-curable polymers that can be added for specific property or processing modifications include, but are not limited to natural rubber; norbornene polymers such as polydicyclopentadiene; styrene-isoprene-styrene copolymers and butadiene-acrylonitrile copolymers; unsaturated polyesters; and the like. Levels of these copolymers are generally less than 50 vol. % of the resin system.

In some embodiments, the thermosetting resin comprises a poly(arylene ether), which can be in the form of a homopolymer or a copolymer, including a graft or a block copolymer. Combinations of various forms can be used. Poly(arylene ether)s comprise a plurality of structural units of structure:

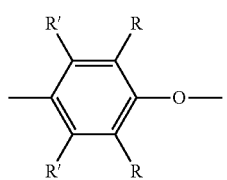

(15)

wherein for each structural unit, each R and R' is independently hydrogen, primary or secondary $C_{1-7}$ alkyl, phenyl, $C_{1-7}$ aminoalkyl, $C_{1-7}$ alkenylalkyl, $C_{1-7}$ alkynylalkyl, $C_{1-7}$ alkoxy, $C_{6-10}$ aryl, and $C_{6-10}$ aryloxy. In some embodiments, each R is independently $C_{1-7}$ alkyl or phenyl, for example, $C_{1-4}$ alkyl, and each R' is independently hydrogen or methyl.

Exemplary poly(arylene ether)s include poly(2,6-dimethyl-1,4-phenylene ether), poly(2,6-diethyl-1,4-phenylene ether), poly(2,6-dipropyl-1,4-phenylene ether), poly(2-methyl-6-allyl-1,4-phenylene ether), poly(di-tert-butyl-dimethoxy-1,4-phenylene ether), poly(2,6-dichloromethyl-1,4-phenylene ether, poly(2,6-dibromomethyl-1,4-phenylene ether), poly(2,6-di(2-chloroethyl)-1,4-phenylene ether), poly(2,6-ditolyl-1,4-phenylene ether), poly(2,6-dichloro-1,4-phenylene ether), poly(2,6-diphenyl-1,4-phenylene ether), and poly(2,5-dimethyl-1,4-phenylene ether). A useful poly(arylene ether) comprises 2,6-dimethyl-1,4-phenylene ether units, optionally in combination with 2,3,6-trimethyl-1,4-phenylene ether units.

The poly(arylene ether), preferably a poly(phenylene ether), can be vinyl or allyl terminated, for example dimethacrylated to obtain PPE-DMA. Optionally, the poly(arylene ether) can be functionalized using a polyfunctional compound having in the molecule both (i) a carbon-carbon double bond or a carbon-carbon triple bond, and (ii) one or more of a carboxy group, including a carboxylic acid, anhydride, amide, ester, or acid halide. In some embodiments the functional group is a carboxylic acid or ester group. Examples of polyfunctional compounds that can provide a carboxylic acid functional group include maleic acid, maleic anhydride, fumaric acid, and citric acid. A poly(arylene ether) can be co-curable with polybutadiene or polyisoprene polymer(s) or other thermosetting resins.

For example, suitable functionalized poly(arylene ether)s include the reaction product of a poly(arylene ether) and a cyclic carboxylic acid anhydride. Examples of suitable cyclic anhydrides are maleic anhydride, succinic anhydride, glutaric anhydride, adipic anhydride, and phthalic anhydride, more preferably, maleic anhydride. Modified poly(arylene ethers) such as maleinated poly(arylene ethers) can be produced by methods as described in U.S. Pat. No. 5,310,820, or are commercially available. Examples of commercially available suitable modified and unmodified poly(arylene ethers) include PPE-MA from Asahi (a maleinized poly(arylene ether)), and Blendex® HPP820 from Chemtura (an unmodified poly(arylene ether), SA90 and SA120 from SABIC. The poly(arylene ether) can have a relatively high number average molecular weight, greater than 500 Daltons, preferably 1000 to 100,000, more preferably 1000 to 10,000 Daltons, as determined by gel permeation chromatography (GPC), typically as specified by the manufacturer. Thus, it can be used as a solid, rather than a liquid.

In some embodiments, the thermosetting composition comprises a polyarylene ether resin, for example, a PPE-dimethacrylate resin, in which are dispersed particles of poly(TAIC/TAC), TAIC/TAC monomer, and optionally fused silica or other inorganic filler. A non-woven or woven fabric such as woven E-glass can be used in prepregs and reinforced laminates. Additionally, a flame retardant and a peroxide initiator can be included. Dielectric substrates comprising such thermosetting composition can exhibit: (1) a $D_f$ less than or equal to 0.0060 at 10 GHz (2) a $T_g$ greater than 200° C. (3) a $T_d$ (5%) greater than 400° C., or a copper (ST HTE) peel strength greater than 4 lbs/in.

As another thermosetting resin, homopolymers and copolymers comprising units derived from butadiene, isoprene, or mixtures thereof can be used. Units derived from other copolymerizable monomers can also be present, for example in the form of grafts or blocks. Exemplary copolymerizable monomers include, but are not limited to, vinylaromatic monomers, for example substituted and unsubstituted monovinylaromatic monomers such as styrene, 3-methylstyrene, 3,5-diethylstyrene, 4-n-propylstyrene, alpha-methylstyrene, alpha-methyl vinyltoluene, para-hydroxystyrene, 4-acetoxy styrene, para-methoxystyrene, alpha-chlorostyrene, alpha-bromostyrene, dichlorostyrene, dibromostyrene, tetra-chlorostyrene, and the like; and substituted and unsubstituted divinylaromatic monomers such as divinylbenzene, divinyltoluene, and the like. Combinations comprising at least one of the foregoing copolymerizable monomers can also be used. Exemplary thermosetting resins of this type include, but are not limited to, butadiene homopolymers, isoprene homopolymers, butadiene-vinylaromatic copolymers such as butadiene-styrene, isoprene-vinylaromatic copolymers such as isoprene-styrene copolymers, and the like.

Copolymers can be broadly classified as "polybutadienes" by their manufacturers, for example Nippon Soda Co., Tokyo, Japan, and Cray Valley Hydrocarbon Specialty Chemicals, Exton, Pa. Mixtures of such resins can also be used, for example, a mixture of a polybutadiene homopolymer and a poly(butadiene-isoprene) copolymer. Combinations comprising a syndiotactic polybutadiene can also be used. Thermosetting polybutadiene or polyisoprene resin can be liquid or solid at room temperature. Suitable liquid resins can have a number average molecular weight greater than 5,000 Daltons (Da) but generally have a number average molecular weight of less than 5,000 Da (most preferably 1,000 to 3,000 Da). Thermosetting polybutadiene or polyisoprene resins, resulting from at least 85 wt. % 1,2 addition, are preferred because they exhibit the greatest crosslink density upon cure, due to the large number of pendent vinyl groups available for crosslinking. Also, unsaturated thermosetting resins resulting from the ring opening polymerization (ROMP) of norbornene monomer can be used in the precursor composition.

The above-mentioned thermosetting resins, characterized by low polarity, can exhibit the desirable features of low dielectric constant and low loss. Combinations of low polarity resins with minor amounts of higher polarity resins can also be used, non-limiting examples including such resin combinations as epoxy and poly(phenylene ether) or cyanate ester and poly(phenylene ether). Compositions based on polybutadiene, polyisoprene, or butadiene- and isoprene-containing copolymers are especially useful. To state that a thermosetting composition is "based on" one or more thermosetting resins means that the thermosetting composition comprises more of that thermosetting resin than any other resin, preferably greater than 50 wt. % of the total resin (including reaction monomers and oligomers, exclusive of filler) used to make the dielectric substrate, including reactive monomers.

Thermosetting resins can also be modified, for example the resins can be hydroxyl-terminated, methacrylate-terminated, or carboxylate-terminated resins. Post-reacted resins can be used, such as epoxy-, maleic anhydride-(maleinized), or urethane-modified butadiene or isoprene resins.

A thermosetting resin, for example PPE (inclusive of modified PPE such as PPE-DMA) or polybutadiene or polyisoprene, can be present in the resin system of a dielectric layer, for example a prepreg or other circuit substrate, in an amount of 10 to 70 wt. %, preferably 50 to 100 wt. %, more preferably 60 to 90 wt. % based on the total weight of resin (including the poly(TAIC/TAC) particles), optionally in combination with up to 30 wt. %, preferably up to 15 wt. % based on total resin weight of other reactive compounds such as bis(vinyl phenyl) methane, bis(vinyl phenyl)ethane, bis(vinyl phenyl) hexane, or a combination comprising at least one of the foregoing. Alternatively, the thermosetting resin can be present in an amount of 10 to 55 wt. %, more preferably 15 to 45 wt. %, each, based on the total weight (including any filler) of the composition.

Other polymers or compounds that can co-cure with the thermosetting resins can be added for specific property or processing modifications. For example, in order to improve the stability of the dielectric strength and mechanical properties of the electrical substrate material over time, a lower molecular weight ethylene propylene elastomer can be used in the resin systems. An ethylene propylene elastomer as used herein is a copolymer, terpolymer, or other polymer comprising primarily ethylene and propylene. Ethylene propylene elastomers can be further classified as EPM copolymers (i.e., copolymers of ethylene and propylene monomers) or EPDM terpolymers (i.e., terpolymers of ethylene, propylene, and diene monomers). Ethylene propylene diene terpolymer rubbers, in particular, have saturated main chains, with unsaturation available off the main chain for facile cross-linking. Liquid ethylene propylene diene terpolymer rubbers, in which the diene is dicyclopentadiene, are preferred.

Useful molecular weights of the ethylene propylene rubbers are less than 10,000 average molecular weight. Suitable ethylene propylene rubbers include an ethylene propylene rubber having an average molecular weight ($M_w$) of 7,200, which is available from Lion Copolymer, Baton Rouge, La., under the trade name TRILENE CP80; a liquid ethylene propylene dicyclopentadiene terpolymer rubber having a molecular weight of 7,000, which is available from Lion Copolymer under the trade name of TRILENE 65; and a liquid ethylene propylene ethylidene norbornene terpolymer, having a molecular weight of 7,500, which is available from Uniroyal Chemical Co. under the name TRILENE 67.

The ethylene propylene rubber is preferably present in an amount effective to maintain the stability of the properties of the substrate material over time, in particular the dielectric strength and mechanical properties. Typically, such amounts are up to 20 wt. % with respect to the total weight of the total resin ("resin system"), more preferably 4 to 20 wt. %, even more preferably 6 to 12 wt. %.

Another type of co-curable polymer that can be included in a thermosetting composition is an unsaturated polybutadiene- or polyisoprene-containing elastomer. This component can be a random or block copolymer of primarily 1,3-addition butadiene or isoprene with an ethylenically unsaturated monomer, for example a vinylaromatic compound such as styrene or alpha-methyl styrene, an acrylate or methacrylate such as methyl methacrylate, or acrylonitrile. The elastomer is preferably a solid, thermoplastic elastomer comprising a linear or graft-type block copolymer having a polybutadiene or polyisoprene block, and a thermoplastic block that preferably is derived from a monovinylaromatic monomer such as styrene or alpha-methyl styrene. Suitable block copolymers of this type include styrene-butadiene-styrene triblock copolymers, for example those available from Dexco Polymers, Houston, Tex., under the trade name VECTOR 8508M, from Enichem Elastomers America, Houston, Tex., under the trade name "SOL-T-6302," and those from Dynasol Elastomers, under the trade name CALPRENE 401; styrene-butadiene diblock copolymers; and mixed triblock and diblock copolymers containing styrene and butadiene, for example those available from Kraton Polymers, Houston, Tex., under the trade name KRATON D1118. KRATON D1118 is a mixed diblock/triblock styrene and butadiene containing copolymer, containing 35 wt. % styrene.

The optional polybutadiene- or polyisoprene-containing elastomer can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. An exemplary second block copolymer of this type is KRATON GX1855 (commercially available from Kraton Polymers), which is believed to be a mixture of a styrene-high 1,2-butadiene-styrene block copolymer and a styrene-(ethylene-propylene)-styrene block copolymer.

Typically, the unsaturated polybutadiene- or polyisoprene-containing elastomer component is present in the resin system in an amount of 2 to 60 wt. % with respect to the total resin system, more preferably 5 to 40 wt. %, or even more preferably 10 to 20 wt. %.

Crosslinking agents in a thermosetting composition of a circuit material increase crosslink density. In addition to TAIC/TAC, which can provide high density crosslinking, optional additional crosslinkers (coagents) can include, for example divinylaromatic compounds such as divinyl benzene, e.g., a polybutadiene-styrene crosslinked with divinyl benzene. Still other optional crosslinkers are pentaerythritol tetraacrylate (PETA) or isocyanuric acid tris(2-acryloyloxyethyl) ester (THEIC triacrylate) which can be used as crosslinking coagents with TAIC/TAC, to provide further crosslink functionality. Still other optional crosslinkers include diallyl phthalate and other multifunctional acrylate monomers (e.g., the SARTOMER resins available from Sartomer USA, Newtown Square, Pa.), and a combination comprising at least one of the foregoing, all of which are commercially available. The total cross-linking agent content of the thermosetting composition can be readily determined by one of ordinary skill in the art depending, for example, upon the amount of the other constituent components and the properties desired in the final product for a particular application.

The composition for the dielectric layer or substrate can also comprise one or more curing agents for the resin system to accelerate the curing reaction of the polyenes having olefinic reactive sites. The curing agents comprise free-radical initiators. Radical initiators are substances that can produce radical species under appropriate conditions and provide free radical polymerization. These substances generally provide weak bonds, i.e., bonds that have small dissociation energy. Conventional free-radical initiators can include peroxide initiators, azo initiators, carbon-carbon initiators, persulfates, hydrazines, hydrazides, benzophenones, halogens, or blends thereof that decompose into free radicals during a curing process.

Commercially available C—C initiators include, for example, 2,3-dimethyl-2,3-diphenylbutane (CAS No. 1889-67-4, from Akzo Nobel under the trade name of PERKADOX 30, from Degussa under the brand name of CCDFB-90, and from Nippon Oil & Fat Corporation under the trade name of NOFINER; 3,4-dimethyl-3,4-diphenylhexane (CAS No. 10192-93-5) from Degussa under the brand name of CCDFH); poly(1,4-diisopropylbenzene) (CAS No. 100-18-5) from Degussa under the brand name of CCPIB; and a combination comprising at least one of the foregoing. Commercial examples of suitable peroxide initiators include, but are not limited to, Varox® 231XL and DCP-R from AtoFina, Perkadox® BC and 14 from Akzo Nobel, and Elastochem® DCP-70 from Rhein Chemie. Other peroxides and mixtures of peroxides having different activation temperatures may be employed. Varox® VC-R is $\alpha'$-di-(t-butyl peroxy)diisopropylbenzene compound having a molecular weight of 338 Da and a melting point of 50° C.

Total amounts of the free-radical initiators can optionally range from 0.5 to 10 wt. %, preferably 1 to 6 wt. %, more preferably 2 to 5 wt. % of the total reactive resin (not including the poly(TAIC/TAC) particles that are relatively unreactive and relatively insoluble in typical formulation solvents). The actual amount of the free-radical initiator added, however, can vary depending on the specific initiator compound used and the specific formulation of the precursor composition to be used.

In another embodiment, the circuit material comprises a thermoplastic polymer or a combination of thermoplastic polymers, in the absence of a thermosetting resin. Examples of thermoplastic polymers that can be used include, among others, thermoplastic polyolefins, copolymers of ethylene and norbornene (cyclic olefin copolymers), polytetrafluoroethylene (PTFE), and high-$T_m$, non-PTFE thermoplastics such as those in the in XT/Duroid™ 8000 series laminates from Rogers Corp. (Rogers, Conn.), and a combination comprising at least one of the foregoing.

Optionally, the precursor composition for the dielectric layer in a circuit material can further comprises particulate fillers. Examples of suitable fillers include titanium dioxide (rutile and anatase), barium titanate, strontium titanate, silica (particles and hollow spheres) including fused amorphous silica, fumed silica, corundum, cordierite, wollastonite, aramide fibers or fibrids (e.g., Kevlar®), core shell rubber particles, boron nitride fibers, fiberglass, $Ba_2Ti_9O_{20}$, glass spheres, quartz, beryllia, alumina, magnesia, mica, talcs, nanoclays, aluminosilicates (natural and synthetic), magnesium oxide, and magnesium hydroxide. Combinations of fillers can also be used. More preferably, rutile titanium dioxide and amorphous silica are especially desirable because these fillers have a high and low dielectric constant, respectively, thereby permitting a broad range of dielectric constants combined with a low dissipation factor to be achieved in the final cured product by adjusting the respective amounts of the two fillers in the composition. Most preferably, fused spherical silica particles can be used, in combination with a minor amount of titanium dioxide. Use of particles of boron nitride, aluminum nitride, silicon carbide, or other ceramic thermally conductive particles, for example, having a thermal conductivity of at least 20 W/m-K, can be used to enhance thermal conductivity.

The precursor composition for a circuit material, preferably for a prepreg, can optionally further include woven or nonwoven, thermally stable webs of a suitable fiber, inorganic or organic, for example, glass (E, S, D, L and NE glass), including flat glass or close-weaved fiber glass, or high temperature organic fibers such as LCP, PEI and PBO. Thermally stable fiber reinforcement can provide a circuit laminate with a means of controlling shrinkage upon cure within the plane of the laminate. In addition, the use of fibrous web reinforcement renders a circuit substrate with a relatively high mechanical strength and modulus. Nonwoven mats of polymeric or glass fibers can also be used.

In some embodiments, the precursor composition comprises 10 to 70 wt. %, preferably greater than 30 to 65 wt. %, more preferably 40 to 60 wt. %, based on the total weight of the precursor composition, of inorganic filler. The volume percent of inorganic filler in the dielectric substrate can be, for example 15 to 55 volume percent preferably 20 to 50 volume percent, more preferably 25 to 45 volume percent, most preferably 30 to 40 volume percent.

In an optional embodiment, such inorganic filler can be coated, i.e., surface treated. Examples of coated filler can include silane coated, alumina coated, and a combination comprising at least one of the foregoing, preferably silica-methyl hydrogen polysiloxane coated filler. Examples of the surface-treating agent that can be used to form silica, alumina or silane coatings can include, without limitation, methyl hydrogen polysiloxane such as APS-219 from Advanced Polymers Inc., MH1107 Fluid from Dow Corning, silane coupling agents such as vinyltrichlorosilane, vinyltrimethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, N-β(aminoethyl)γ-aminopropylmethyldimethoxysilane, N-β(aminoethyl)γ-aminopropyltrimethoxysilane, N-β(aminoethyl)γ-aminopropyltriethoxysilane, γ-aminopropyltrimethoxysilane, γ-aminopropyltriethoxysilane, N-phenyl-γ-aminopropyltrimethoxysilane and γ-mercaptopropyltrimethoxysilane.

In addition to the one or more of the polymers, fillers, and additives described above, the precursor composition for a dielectric layer can further optionally independently comprise additives such as viscosity modifiers, wetting agents, deaerators, antioxidants, and the like. The additives are selected so as to enhance or not substantially adversely affect electrical and physical properties such as dielectric constant, dissipation factor, water absorbance, or other desired properties of the circuit material.

Methods for the manufacture of the precursor compositions, the dielectric layers, the circuit materials, including circuit subassemblies, circuits and multilayer circuits are known, and can be used as needed. For example, the precursor compositions can be formed by combining the various components, in any order, optionally in the melt or in an inert solvent, and then formed into the dielectric layer. The combining can be by any suitable method, such as blending, mixing, or stirring. In an embodiment, the components used to form the precursor composition can be combined by being dissolved or suspended in a solvent to provide a coating mixture or solution. The solvent is selected so as to dissolve the polymer or thermosetting resin, disperse particulate additives and any other optional additives that can be present, and to have a convenient evaporation rate for forming and drying. A non-exclusive list of possible solvents is xylene, toluene, methyl ethyl ketone, methyl isobutyl ketone, hexane, and higher liquid linear alkanes, such as heptane, octane, nonane, and the like, cyclohexane, isophorone, and various terpene-based solvents. Specific exemplary solvents include xylene, toluene, methyl ethyl ketone, methyl isobutyl ketone, and hexane, and still more preferably xylene and toluene. The concentration of the components of the composition in the solution or dispersion is not critical and will depend on the solubility of the components, the filler level used, the method of application, and other factors. In general, the solution comprises 10 to 50 wt % solids (all components other than the solvent), more preferably 15 to 40 wt % solids, based on the total weight of the solution.

In a specific embodiment, a method of making a circuit material includes emulsion polymerizing triallyl isocyanurate, triallyl cyanurate, or a combination comprising at least one of the foregoing to form polymer particles having a decomposition temperature greater than 400° C.; filtering the polymer particles, optionally washing the polymer particles with an aqueous base, and drying the polymer particles to form a powder; combining the polymer particles with a precursor composition comprising resin, thermosetting polymer, or a combination comprising at least one of the foregoing; and forming the precursor composition into a dielectric layer Forming the dielectric layer can be by known methods. For example, the precursor composition can be formed into a layer by casing onto a carrier from which it is later released, or alternatively onto a substrate such as a conductive metal layer that will later be formed into a layer of a circuit material. In an embodiment, the combined components are cast onto or impregnated with a fibrous substrate as described above. After the article or layer is formed, any solvent is allowed to evaporate under ambient conditions, or by forced or heated air, for example at 20 to 200° C., preferably 30 to 150° C., more preferably 40 to 100° C. A thermoplastic composition can be allowed to cool to form the dielectric layer. The layer can be uncured, partially cured (B-staged), or fully cured in the drying process, or the layer can be partially or fully cured, if desired, after drying. The resulting layer can be stored prior to use.

In a specific embodiment, a making a circuit material includes emulsion polymerizing triallyl isocyanurate, triallyl cyanurate, or a combination comprising at least one of the foregoing to obtain polymeric particles; filtering, optionally washing the polymeric particles with an aqueous base, and drying the polymeric particles to form a powder having a decomposition temperature greater than 400° C.; mixing the polymeric particles with a precursor composition comprising a thermosetting resin and monomeric triallyl isocyanurate, monomeric triallyl cyanurate, or a combination comprising at least one of the foregoing to obtain a thermosetting composition; forming the thermosetting composition into a dielectric layer; and at least partially curing the thermosetting composition to obtain a product capable of forming a circuit subassembly.

The dielectric layer can be used a buildup layer, a bonding layer, a dielectric substrate layer, or a combination comprising at least one of the foregoing. A circuit subassembly comprising a dielectric layer as disclosed herein can further comprise a conductive metal layer. An optional adhesive layer can be situated between and in direct contact with the dielectric substrate layer and conductive layer.

Where it is desired to form a circuit subassembly, the dielectric layer, including a prepreg, can be disposed on a conductive metal layer and fully cured, e.g., by lamination. In an embodiment, the laminate is formed by placing one or more layers of the dielectric layer between one or two sheets of coated or uncoated conductive layers (an adhesive layer can be disposed between at least one conductive layer and at least one dielectric substrate layer) to form a circuit substrate. The conductive layer can be in direct contact with the dielectric substrate layer, preferably without an intervening layer. Alternatively, an adhesive or bond ply layer can be located between the conductive layer and the dielectric layer. The bond ply layer can be less than 10 percent of the thickness of the dielectric layer. The stack of layered material can then be placed in a press, e.g. a vacuum press, under a pressure and temperature and for duration of time suitable to bond the layers and form a laminate. Lamination (and curing if applicable) can be by a one-step process, for example using a vacuum press, or by a multiple-step process. In an exemplary one-step process, for a PTFE polymer matrix for example, the layered material can be placed in a press, brought up to laminating pressure (e.g., 150 to 400 psi) and heated to laminating temperature (e.g., 260 to 390° C.). The laminating temperature and pressure are maintained for the desired soak time, i.e., 20 minutes, and thereafter cooled (while still under pressure) to below 150° C. a partial peroxide cure step at 150° C. to 200° C. can be conducted, and the partially cured stack can then be subjected to a high-energy electron beam irradiation cure (E-beam cure) or a high temperature cure step under an inert atmosphere. Use of a two-stage cure can impart an unusually high degree of cross-linking to the resulting laminate. The temperature used in the second stage can be, for example 250° C. to 300° C., or the decomposition temperature of the polymer. This high temperature cure can be carried out in an oven but can also be performed in a press, namely as a continuation of the initial lamination and cure step. Particular lamination temperatures and pressures will depend upon the particular compositions used, and are readily ascertainable by one of ordinary skill in the art without undue experimentation.

Useful conductive layers for the formation of the circuit laminates or other multilayer laminates can include, without limitation, stainless steel, copper, gold, silver, aluminum, nickel, zinc, tin, lead, other transition metals, and alloys comprising at least one of the foregoing, with copper being exemplary. There are no particular limitations regarding the thickness of the conductive layer, nor are there any limitations as to the shape, size or texture of the surface of the conductive layer. Preferably, however, the conductive layer can comprise a thickness of 3 micrometers to 200 micrometers, preferably 9 micrometers to 180 micrometers. When two or more conductive layers are present, the thickness of the two layers can be the same or different. As mentioned above, a circuit subassembly having the above-described dielectric layer comprising dispersed particles of poly(TAIC/TAC) can be used with a conductive layer to make circuit materials, circuit laminates, circuits, and multilayer circuits. In an exemplary embodiment, the conductive layer is a copper foil presently used in the formation of circuits, for example, electrodeposited copper foils.

In accordance with various specific embodiments used in preparing a circuit subassembly, FIG. 1 shows an exemplary circuit subassembly, in particular a single clad laminate 110 comprising a conductive metal layer 112 disposed on and in contact with dielectric layer 114 comprising (not shown) dispersed microparticles of poly(TAIC/TAC). By the term microparticles is meant particles having a diameter of under 10 micrometers. An optional glass web (not shown) can be present in dielectric substrate layer 114. It is to be understood that in all of the embodiments described herein, the various layers can fully or partially cover each other, and additional conductive layers, patterned circuit layers, and dielectric layers can also be present. Optional adhesive (bond ply) layers (not shown) can also be present, and can be uncured or partially cured. Many different multi-layer circuit configurations can be formed using the above substrates.

Figure 2:
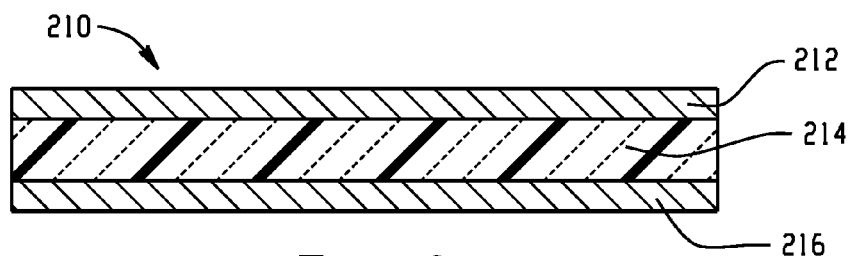
FIG. 2 is a schematic of a double clad laminate.
Figure 3:
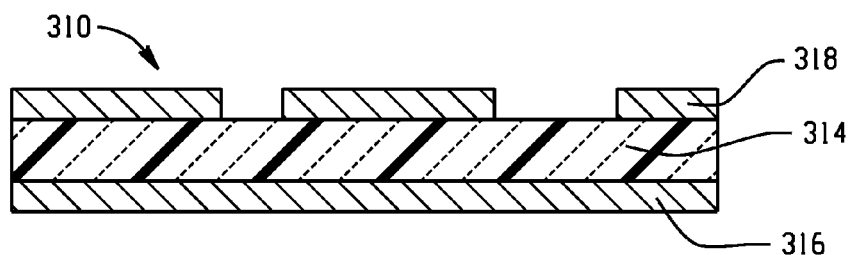
FIG. 3 is a schematic of a double clad laminate with patterned conductive layer.

Another embodiment of a multilayer circuit assembly is shown at 210 in FIG. 2. Double clad circuit layer 210 comprises conductive layers 212, 216 disposed on opposite sides of dielectric layer 214 comprising (not shown) dispersed microparticles of poly(TAIC/TAC). Dielectric substrate layer 214 can comprise a woven web (not shown). A circuit subassembly 310 is shown in FIG. 3, comprising a circuit layer 318 and a conductive layer 316 disposed on opposite sides of a dielectric substrate layer 314 comprising (not shown) dispersed micro particles of poly(TAIC/TAC). Dielectric substrate layer 314 can comprise a woven web (not shown).

Figure 4:
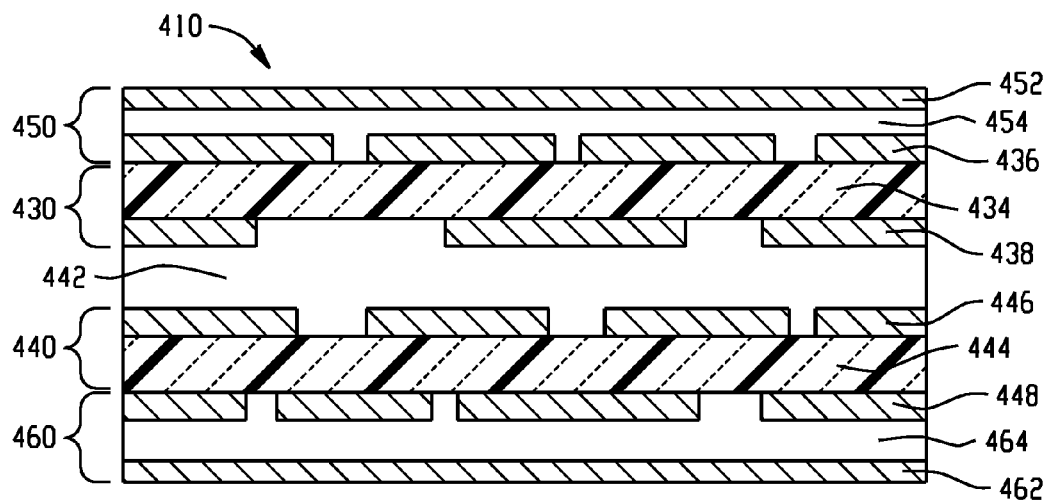
FIG. 4 is a schematic of an exemplary circuit assembly comprising two double clad circuit laminates.

FIG. 4 shows an exemplary multilayer circuit assembly 410 having a first double clad circuit 430, a second double clad circuit 440, and a bond ply 442 disposed there between. Double clad circuit 430 comprises a composite material, in which have been dispersed particles of poly(TAIC/TAC), functioning as dielectric substrate 434 disposed between two conductive circuit layers 436, 438. Double clad circuit 440 comprises a second dielectric substrate 444 disposed between two conductive circuit layers 446, 448, which second dielectric substrate 444 may or may not be a composite material comprising poly(TAIC/TAC) particles. At least one, and optionally both, of dielectric substrates 434, 444 can comprise dispersed poly(TAIC/TAC) particles. Each dielectric substrate layer 434, 444 can comprise a nonwoven glass reinforcement (not shown). Two cap layers 450, 460 are also shown. Each cap layer 450, 460, includes a conductive layer 452, 462 disposed on a bond ply layer 454, 464. In addition, many different multilayer circuit configurations can be formed using tie layers.

As mentioned above, circuit materials and circuit subassemblies as disclosed here can provide various advantages. Specifically, electrical and thermal properties are consistent with those desired in circuits for high frequency and high data speed electrical and electronic applications, particularly a dissipation factor of less than 0.0060, for example 0.0010 to less than 0.0060. More specifically, embodiments disclosed herein can be characterized by any one or more, or all, of the following properties.

| Property/Parameter | Values |
| --- | --- |
| Core Thicknesses, mils | 1 to 20 mils |
| CTE-x/y, ppm/° C. at 50 to 150° C. | <20-25 |
| CTE-z, ppm/° C. at 50 to 150° C. | <50-60 |
| % z-Expansion at 50 to 250° C. | <2.5-3.0 |
| T-300, minutes | >10 |
| $T_d$, $T_d$ (5%), ° C. | >350, >400 |
| $D_f$ (10 GHz) | ≤0.0040, e.g., 0.0010 to ≤0.0040 |
| Cu-Peel (AR/AS), lbs/in | >4.0/>4.0 |
| Solder Float, seconds | >360 |
| UL94 (Thin/Thick) | V0/V0 |

In an embodiment, a circuit material comprises a dielectric layer formed from a precursor thermosetting composition comprising: a thermosetting resin; triallyl isocyanurate, monomeric triallyl cyanurate, or a combination comprising at least one of the foregoing; polymeric particles comprising poly(triallyl isocyanurate), poly(triallyl cyanurate), a copolymer comprising at least one of the foregoing, or a combination comprising at least one of the foregoing, wherein the total cyanurate unit content is at least 12 wt. %, preferably 15 to 25 wt. %, based on the total weight of the thermosetting composition; and wherein the circuit material has a $D_f$ of less than 0.0040 at 10 GHz, preferably less than 0.0035 at 10 GHz. In another embodiment in which the cyanurate monomer is present, the ratio of the monomer to the polymeric particles is 0.4:1 to 1:1 and the circuit material has a $D_f$ from 0.0025 to 0.0035 at 10 GHz, preferably 0.0025 to 0.0033 at 10 GHz, or from 0.0010 to 0.0035 at 10 GHz, preferably from 000010 to 0.0033 at 10 GHz.

In another embodiment, circuit material comprises a dielectric layer formed from a precursor thermosetting composition that comprises, based on total weight of the precursor composition, of: 10 to 40 weight percent of poly (arylene ether) that, in the dielectric layer, forms a continuous polymeric matrix; 5 to 40 weight percent of monomeric triallyl isocyanurate, monomeric triallyl cyanurate, or a combination comprising at least one of the foregoing that in the dielectric layer, crosslinks in the presence of the poly(arylene ether); and 1 to 30 weight percent of polymeric particles of poly(triallyl isocyanurate), poly(triallyl cyanurate), copolymers comprising at least one of the foregoing, or a combination comprising at least one of the foregoing that are dispersed in the continuous polymeric matrix; wherein the circuit material has a $D_f$ of less than 0.0050 at 10 GHz, for example 0.0010 to less than 0.0050 at 10 GHz, or 0.0010 to 0.0040 at 10 GHz, or 0.0010 to 0.0030 at 10 GHz.

In another embodiment, a dielectric layer formed from a thermosetting composition comprises: 22 to 32 wt. % polyphenylene ether (PPE) dimethacrylate resin; 15 to 25 wt. % triallyl isocyanurate monomer; 8 to 18 wt. % triallyl isocyanurate polymer poly(TAIC) homopolymer; 1 to 5 wt. % pentaerythritol tetraacrylate (PETA) or other crosslinking co-agent; 7 to 17 wt. % diethyl aluminum phosphinate or other phosphorus-containing flame retardant; and 22 to 32 wt. % fused silica or other inorganic filler, wherein a circuit material comprising the dielectric layer has a dissipation loss factor (DO of less than 0.0060 at 10 GHz, preferably less than 0.0040 at 10 GHz, more preferably less than 0.0035 at 10 GHz, for example from 0.0010 to less than 0.0060 at 10 GHz, or from 0.0010 to 0.0040 at 10 GHz, preferably from 0.0010 to 0.0035 at 10 GHz; still more preferably with a UL rating of V-0.

In another embodiment, a dielectric layer formed from a thermosetting composition comprises: 23 to 33 wt. % polyphenylene ether (PPE) dimethacrylate resin; 16 to 26 wt. % triallyl isocyanurate monomer; 9 to 19 wt. % triallyl isocyanurate polymer poly(TAIC) homopolymer; 1 to 5 wt. % pentaerythritol tetraacrylate (PETA) or other crosslinking co-agent; 3 to 13 wt. % ethane-1,2-bis(pentabromophenyl) or other halogenated flame retardant; and 23 to 33 wt. % fused silica or other inorganic filler, wherein the circuit material has a $D_f$ of less than 0.0060 at 10 GHz, preferably less than 0.0030 at 10 GHz, more preferably less than 0.0020 at 10 GHz; or from 0.0010 to 0.0060, preferably from 0.0010 to 0.0030 at 10 GHz, or from 0.0010 to less than 0.0020 at 10 GHz.

The invention is further illustrated by the following non-limiting Examples.

EXAMPLES

The Following materials in Table 1 were used in the following Examples

TABLE 1

| Designation | Component and Source | Source |
|---|---|---|
| PPE-DMA | $M_n$ = 1,600 Da | Sabic SA9000 |
| TAIC | Triallyl isocyanurate | Prepared via emulsion polymerization |
| p-TAIC | Polymer of triallyl isocyanurate | |
| PETA | Pentaerythritol triacrylate | |
| MBS | Maleinized butadiene-styrene copolymer | Ricon 184MA6 |
| FR A | Bis-pentabromophenyl ethane | Albemarle Saytex ® 8010 |

TABLE 1-continued

| Designation | Component and Source | Source |
|---|---|---|
| FR B | Aluminium diethyl phosphinate | Clariant ® OP-1230 |
| DYBP | 2,5-Dimethyl-2,5-di-(tert-butyl peroxide hex-3-yne | United Initiators |
| Silica | Fused silica | FB-8S |

Preparation:

In general, a dielectric subassembly is prepared as follows. The composition for the dielectric substrates comprises the components as indicated by the tables herein. Conventional dielectric substrate layer manufacturing methods are employed, preferably the composition of each of Examples 2 to 6 (in Tables 2 to 6) is coated onto glass fabric and dried to make a 2-mil to 10-mil prepreg sheet. After the prepreg is plied up to a specific thickness, lamination is done employing heat/pressure with copper (with or without an adhesive coating applied to it) on both sides of the prepreg to make a double clad laminate. Laminates ranging in thickness from 2-mil to 120-mil are prepared, wherein the laminate may be also cured using continuous flat-bed lamination. Typical cure temperature ranges are between 325° F. (163° C.) and 525° F. (246° C.) employing a pressure of 300-1200 psi.

Testing:

Flame/flameout testing is performed according to Underwriter's Laboratory Method UL-94.

Electrical Properties:

Prior to testing electrical properties, samples were conditioned for 2 hours at 135° C.

The $D_k$ is measured at 3.48 at 10 GHz and the $D_f$ at 0.0035 at 10 GHz for a sample laminate according to "Stripline Test for Permittivity and Loss Tangent at X-Band" test method (IPC-TM-650 2.5.5.5).

Copper peel strength is tested in accordance with the "Peel strength of metallic clad laminates" test method (IPC-TM-650 2.4.8).

Laminates are tested for solder float by floating them on a pot of molten solder at a temperature of 288° C. (550° F.). This procedure involves either continuously floating the laminate samples on the solder or subjecting them to iterative thermal cycling (10 seconds on the solder followed by 60 seconds off the solder). A failure in the solder float test is noted if there is blistering or delamination of the copper foil from the laminate surface.

The T-300 test is the time (in minutes) to delamination according to IPC-TM-650 Time-to-Delamination (TMA Method) 2.4.24.1 A minimum time of 10 minutes is desired.

Example 1A

This example illustrates the preparation of particles of poly(TAIC) for use as a formulation additive in circuit materials. Free-radical emulsion polymerization of triallyl isocyanurate (TAIC) monomer was conducted as represented by the following equation:

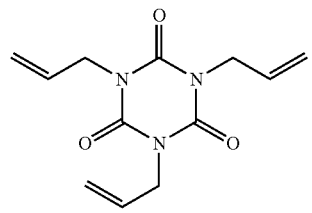
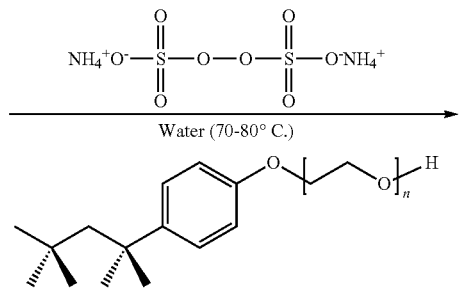

→ Polymer of Triallyl Isocyanurate (p-TAIC)

Water (70-80° C.)

Specifically, to a stainless steel container was added 3100 grams of DI (deionized) water and 500 grams of triallyl isocyanurate (TAIC). In a separate container, 22 grams of ammonium persulfate were dissolved in 110 grams of DI water. On a hotplate, the DI Water/TAIC mixture was heated to 70° C. with high shear mixing. 0.5 Grams of Triton X-100® (Octoxynol-9) emulsifier was added. While maintaining at temperature of 70 to 80° C., eleven additions (12 grams each) of the ammonium persulfate/DI water solution were added over 4.5 hours. The time between additions was 25 minutes. The reaction vessel was then covered and placed into an oven (at 60° C.) overnight (16 hours). Upon cooling to room temperature, the resulting product (poly-TAIC) was Büchner funnel filtered and washed with DI water. The resulting wet-cake was placed into a Pyrex® dish and dried at 105° C. for 20 hours. The product yield was >95%. The resulting product was a low bulk density white powder that exhibited a melting point (decomposition temperature) in excess of 400° C. (752° F.). Higher-speed (more aggressive) mixing was found to micronize the average particle size.

Examples 2-3

The formulations of inventive Examples 2 and 3 (amounts are in parts by weight, except for the woven reinforcement layer) and their properties and results are shown in Table 2.

TABLE 2

| Formulation Component | Ex. 2 | Ex. 3 |
|---|---|---|
| PPE-DMA | 100 | 100 |
| TAIC | 30 | 15 |
| MBS | — | 15 |
| p-TAIC | 50 | 50 |
| FR-A | 30 | 30 |
| Silica | 100 | 100 |
| DYBP Parameter | 1.0 | 1.0 |
| Woven fibrous glass reinforcement, volume percent of Formulation | 79 | 78 |
| Ply Thickness, mils (mm) | 5.6 (0.14) | 5.2 (0.13) |
| Property | | |
| $T_g$ (TMA), ° C. | 196 | 210 |
| CTE-x, y (50-125° C.) | 26, 22 | 25, 22 |
| CTE-z (50-125° C.) | 41 | 43 |
| % z-Expansion (50-260° C.) | 2.3 | 2.1 |
| T-300, minutes | >60 | >60 |
| $T_g$ (DSC), ° C. | 204 | 208 |
| Decomposition Onset Temp, ° C. | 382 | 378 |
| Decomposition (5%) Temp, ° C. | 412 | 412 |
| Electrical Strength, V/mil | 376 | 371 |
| $D_k$ (10 GHz)-3.00 Fixture | 3.195 | 3.166 |
| $D_f$ (10 GHz)-3.00 Fixture | 0.0034 | 0.0036 |
| Copper Peel Strength (AR/AS), lbs/in | 3.9/3.6 | 4.5/4.5 |
| Solder Float, seconds | 171 | 207 |

TABLE 2-continued

| Formulation Component | Ex. 2 | Ex. 3 |
|---|---|---|
| Flammability, UL94 (dried 24 hours at 125° C., Thin/Thick) | V0/V0 | V0/V0 |

The test results indicated that the use of the TAIC polymer made a positive contribution to electrical properties (Dk and Df), thermal properties (Tg, CTE, Td, and solder testing), and processing characteristics (coating, laminating and drilling).

Examples 4-5

The formulations of inventive Examples 4 and 5 were formulated as shown in Table 3 (amounts are in parts by weight, except for the reinforcement layer). Example 4 uses a brominated flame retardant system and Example 5 uses a halogen-free flame retardant system. A standard epoxy lamination was carried out. Properties and results are also shown in Table 3.

TABLE 3

| Formulation Components | Example 4 (parts by weight) | Example 5 (parts by weight) |
|---|---|---|
| PPE-DMA | 100 | 100 |
| TAIC | 75 | 75 |
| p-TAIC | 50 | 50 |
| PETA | 5 | 5 |
| FR-A | 30 | — |
| FR-B | — | 45 |
| Silica | 100 | 100 |
| DYBP, w/w % | 1.0 | 1.0 |
| Parameters | | |
| Woven fibrous glass reinforcement, volume percent of formulation | 80 | 80 |
| Ply Thickness, mils | 6.0 | 6.2 |
| Property | Example 4 | Example 5 |
| Tg (TMA), ° C. | 205 | 218 |
| CTE-x, ppm/° C. (50 to 125° C.) | 28 | 25 |
| CTE-y, ppm/° C. (50 to 125° C.) | 25 | 21 |
| CTE-z, ppm/° C. (50 to 125° C.) | 47 | 44 |
| % z-Expansion (50-260° C.) | 2.0 | 1.7 |
| T-300, minutes | >60 | >60 |
| Tg (DSC, 1st/2nd Pass), ° C. | 207/207 | 219/222 |
| Td, ° C. | 382 | 403 |
| Td (5%), ° C. | 412 | 441 |
| Electrical Strength, V/mil | 464 | 300 |
| Dk (10 GHz)-3.00 Fixture | 3.14 | 3.10 |
| Df (10 GHz)-3.00 Fixture | 0.0029 | 0.0032 |
| Oak 1/1 Peel (AR/AS), lbs/in | 5.2/4.8 | 4.2/4.0 |
| Solder Float, seconds | 900/900 | 900/900 |
| Flammability, UL94 | V0/V0 | V0/V1 |

Based on the results in Table 3, it was demonstrated that for both halogenated (Ex. 3) and halogen-free (Ex. 4) compositions, a circuit material having an improved combination of physical and electrical properties, including low $D_f$, could be obtained, even with reduced inorganic filler content. Example 4 exhibited greater peel strength and lower $D_f$, whereas the halogen-free Example 5 exhibited a higher decomposition temperature while exhibiting comparable properties in other performance areas. It was further observed that use of the poly(TAIC) particles as a rheology modifier allowed the incorporation of additional isocyanurate unit content than in Examples 4-5, without the resin runback that can otherwise occur during prepreg manufacture. Increased isocyanurate unit content resulted in lower $D_f$ at 10 GHz compared to the inventive Examples 2-3.

As shown in Table 4, the weight percent isocyanurate content for the composition of each of examples 2 to 4 can be calculated and related to the $D_f$ of the material.

TABLE 4

| % Isocyanurate Unit Content | $D_f$ |
|---|---|
| 12.9 | 0.0034 |
| 10.5 | 0.0036 |
| 17.4 | 0.0029 |
| 16.7 | 0.0032 |

Figure 5:
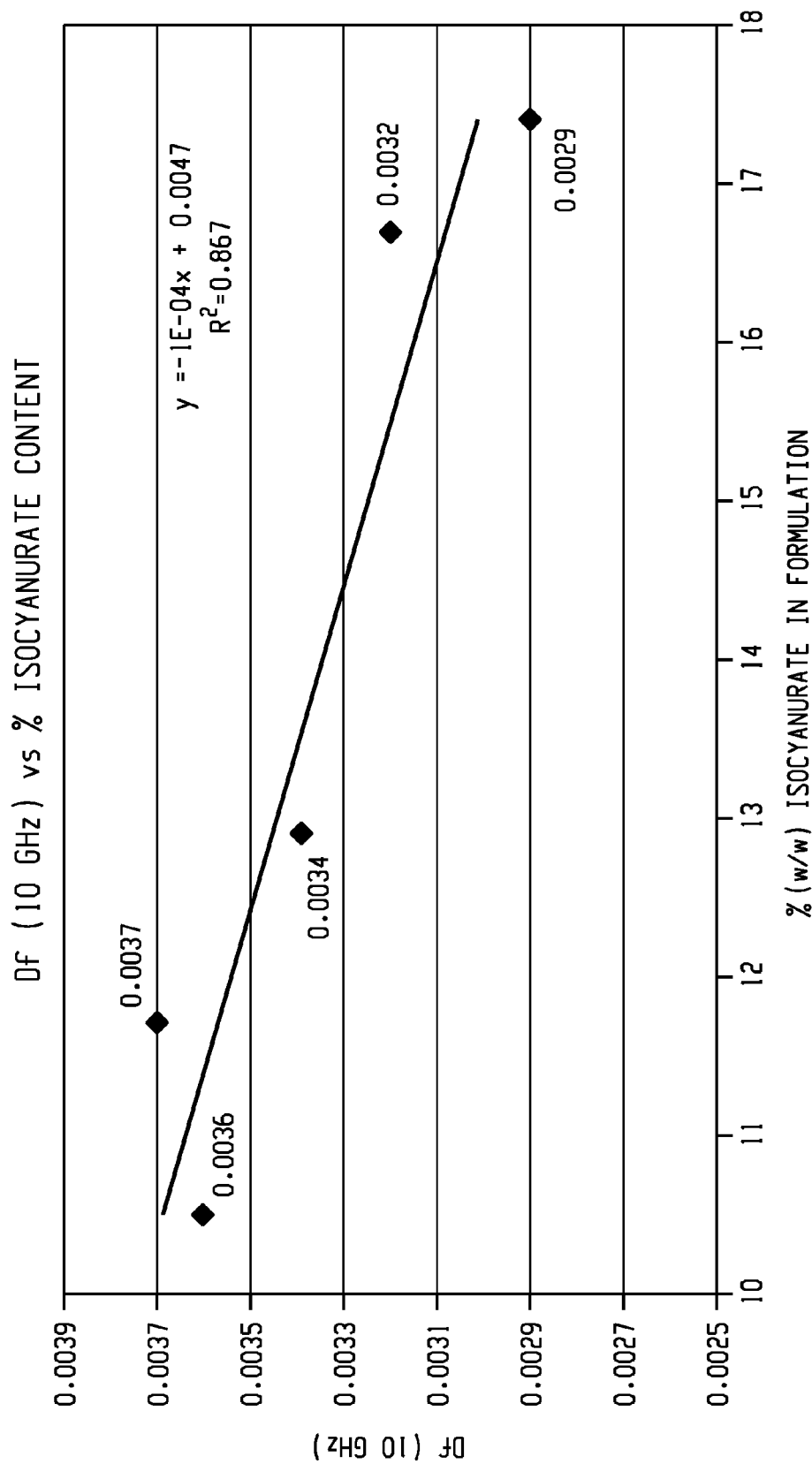
FIG. 5 is a graph of Df at 10 GHz versus the isocyanurate unit content for the compositions of Examples 2 to 5.

FIG. 5 is a graph of $D_f$ at 10 GHz versus the isocyanurate unit content for the compositions of Examples 2 to 5. As shown in the graph, a progressively lower $D_f$ can be obtained for laminates, at comparable percent resin content, derived from formulations containing progressively greater amounts of isocyanurate. In comparison, a composition without poly(TAIC), containing the same amount of poly(arylene ether) polymer, monomeric TAIC (54 parts, which was near the maximum allowed by processing conditions), silica (77 parts), and peroxide initiator (1.8 parts), with a calculated cyanurate unit content of 11.7%, resulted in a comparatively higher $D_f$ of 0.0037 at 10 GHz.

Example 6

This example illustrates the preparation of alkaline washed p-TAIC for use as a formulation additive in circuit materials. Free-radical emulsion polymerization of triallyl isocyanurate (TAIC) monomer followed by an aqueous alkaline treatment to remove residual sulfates was conducted as represented by the following schematic:

Specifically, to a stainless steel container was added 3100 grams of DI (deionized) water and 500 grams of triallyl isocyanurate (TAIC). In a separate container, 22 grams of ammonium persulfate were dissolved in 110 grams of DI water. On a hotplate, the DI Water/TAIC mixture was heated to 70° C. with high shear mixing. 0.5 grams of Triton X-100® (Octoxynol-9) emulsifier was added. While maintaining at temperature of 70 to 80° C., eleven additions (12 grams each) of the ammonium persulfate/DI water solution were added over 4.5 hours. The time between additions was about 25 minutes. The reaction vessel was then covered and placed into an oven (at 60° C.) overnight (16 hours). Upon removal from the oven, the reaction vessel was cooled to room temperature. In a separate container, 27.8 grams of potassium hydroxide (85.6% assay, 1.1 equivalents) was dissolved in 70 grams of DI water. The aqueous potassium hydroxide solution was then added to the reaction vessel followed by low shear mixing for 30 minutes. The resulting aqueous suspension of p-TAIC was Büchner funnel filtered and washed with DI water twice. The resulting wet-cake was placed into a Pyrex® dish and dried at 105° C. for 20 hours. The product yield was >95%. The resulting product was a low bulk density white powder that exhibited a melting point (decomposition temperature) in excess of 400° C. (752° F.).

Example 7

The contribution of p-TAIC to $D_f$ was determined by preparing compression-molded plaques comprising high density polyethylene and 30 wt. % p-TAIC that had been prepared in accordance with Example 1 (no treatment), Example 6 (washing with aqueous sodium carbonate or potassium hydroxide), to remove residual sulfates. The plaques were tested as received, for 16 hours at 23° C. at 50% relative humidity (RH), or for for 24 hours at 23° C. at 50% relative humidity, or for 88 hours at 23° C. at 50% relative humidity, or for 1 hour at 105° C. Results are shown in Table 5.

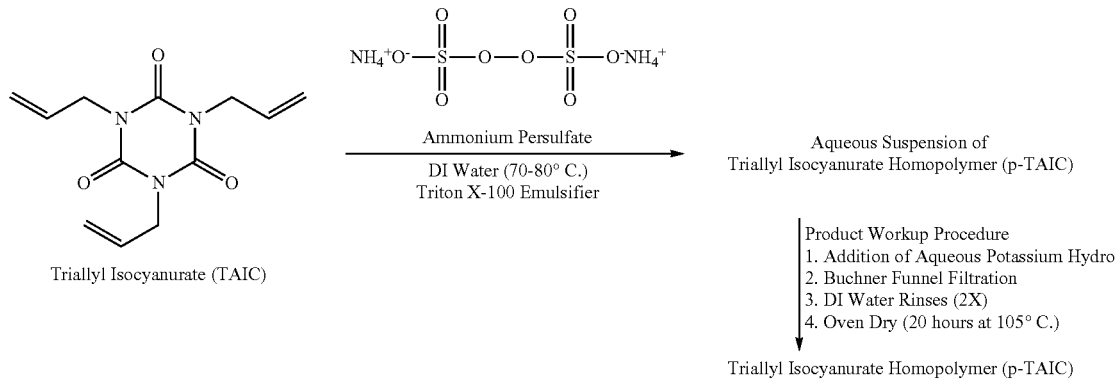

TABLE 5

| p-TAIC (w/w %) | Alkaline wash | As-received | 16 h, 23° C., 50% RH | 24 h, 23° C., 50% RH | 88 h, 23° C., 50% RH | 1 h, 105° C., |
|---|---|---|---|---|---|---|
| 0 | — | 0.0013 | 0.0011 | 0.0011 | 0.0011 | 0.0011 |
| 30 | None | 0.0055 | — | — | — | 0.0040 |
| 30 | $Na_2CO_3$ | 0.0040 | 0.0038 | 0.0035 | 0.0031 | 0.0018 |
| 30 | KOH | 0.0041 | — | — | — | 0.0014 |
| 30 | KOH | 0.0033 | — | — | — | 0.0015 |

It was found that use of the alkaline-washed p-TAIC led to even lower Df values than the p-TAIC of Example 1. It was surprising that the contribution of the p-TAIC to $D_f$ was as low as shown in Table 5.

The invention is further illustrated by the following Embodiments.

Embodiment 1

A circuit material, comprising a dielectric layer comprising a polymer component, wherein the polymer component comprises: a continuous polymeric matrix; and particles comprising a poly(triallyl isocyanurate), a poly(triallyl cyanurate), a copolymer comprising at least one of the foregoing, or a combination comprising at least one of the foregoing, wherein the particles are dispersed in the continuous polymeric matrix; and wherein the circuit material has a $D_f$ of less than 0.0060 at 10 GHz, preferably less than 0.0040 at 10 GHz, more preferably less than 0.0030 at 10 GHz, and a $D_k$ of less than 3.8 at 10 GHz.

Embodiment 2

The circuit material of Embodiment 1, wherein the polymer component comprises 10 to 90 weight percent of the continuous polymeric matrix, based on a total weight of the polymer component, and the polymer matrix has a $T_g$ greater than 170° C. and a $T_d$ greater than 350° C.

Embodiment 3

The circuit material of Embodiment 1 or 2, wherein the continuous polymeric matrix is formed from a thermosetting resin comprising at least two free-radically reactive functional groups, and that has an LOI of less than 20.

Embodiment 4

The circuit material of any of the preceding Embodiments, wherein the polymer component comprises 1 to 50 weight percent of the polymer particles and 1 to 50 weight percent of monomeric triallyl isocyanurate, monomeric triallyl cyanurate, or a combination comprising at least one of the foregoing, each based on the total weight of the polymer component.

Embodiment 5

The circuit material of any of the preceding Embodiments, wherein the total unit isocyanurate or cyanurate content of the polymer component is at least 12 weight percent, based on the total weight of the thermosetting composition; and wherein the circuit material has a $D_f$ less than 0.0040 at 10 GHz.

Embodiment 6

The circuit material of any of the preceding Embodiments, wherein the particles are emulsion polymerized particles wherein the particles have one or both of a decomposition temperature of greater than 400° C. or a mean particle size of 0.1 to 10 micrometers, determined using dynamic light scattering.

Embodiment 7

The circuit material of any of the preceding Embodiments, wherein the continuous polymeric matrix comprises the reaction product of a composition comprising a thermoplastic polymer, a thermosetting resin, or a combination comprising at least one of the foregoing, and monomeric triallyl isocyanurate, monomeric triallyl cyanurate, or a combination comprising at least one of the foregoing.

Embodiment 8

The circuit material of any of the preceding Embodiments, wherein the continuous polymeric matrix is a reaction product of a thermosetting resin composition, wherein the circuit material has a $D_f$ of less than 0.0050 at 10 GHz, preferably less than 0.0040 at 10 GHz, and preferably wherein the thermosetting resin composition comprises a vinyl-functional poly(arylene ether), butadiene, isoprene, or a combination comprising at least one of the foregoing, and optionally a crosslinking agent.

Embodiment 9

The circuit material of Embodiment 7, wherein the thermosetting resin composition comprises, based on total weight of the thermosetting composition 10 to 40 weight percent of poly(arylene ether); 5 to 40 weight percent of the monomeric triallyl isocyanurate, monomeric triallyl cyanurate, or a combination comprising at least one of the foregoing; and 1 to 30 weight percent of the polymeric particles of poly(triallyl isocyanurate), poly(triallyl cyanurate), copolymers comprising at least one of the foregoing, or a combination comprising at least one of the foregoing; wherein the circuit material has a $D_f$ of less than 0.0050 at 10 GHz, preferably less than 0.0040 at 10 GHz.

Embodiment 10

The circuit material of any of Embodiments 1 to 6, wherein the continuous polymer matrix comprises a thermoplastic cyclic olefin copolymer. a polytetrafluoroethylene, or a polyethylene.

Embodiment 11

The circuit material of any of the preceding Embodiments, wherein the dielectric layer further comprises an inorganic filler, preferably 10 to 70 weight percent of inorganic filler based on the total weight of the dielectric layer, more preferably 15 to 60 weight percent of fused silica filler based on the total weight of the dielectric layer.

Embodiment 12

The circuit material of any of the preceding Embodiments, wherein the dielectric layer has a thickness of 1 to 1000 micrometers.

Embodiment 13

The circuit material of any of the preceding Embodiments, wherein the dielectric layer is a prepreg comprising a woven or non-woven, organic or inorganic, fabric reinforcement in an amount of 5 to 40 volume percent, based on the total volume of the dielectric layer.

Embodiment 14

The circuit material of Embodiment 1, further comprising a conductive metal layer disposed on the dielectric layer.

Embodiment 15

The circuit material of Embodiment 12, wherein the conductive metal layer is patterned to form a circuit.

Embodiment 16

A circuit subassembly, comprising a conductive metal layer; and the dielectric layer of any one or more of Embodiments 1 to 15 wherein a peel strength between the conductive metal layer and the dielectric layer is greater than 4.0 pounds per inch.

Embodiment 17

A method of making a dielectric layer for a circuit material, the method comprising combining a thermoplastic polymer, a thermosetting resin, or a combination comprising at least one of the foregoing with a plurality of polymer particles comprising poly(triallyl isocyanurate), poly(triallyl cyanurate), a copolymer comprising at least one of the foregoing, or a combination comprising at least one of the foregoing, and having decomposition temperature greater than 400° C., to provide a precursor composition; and forming the precursor composition into a dielectric layer.

Embodiment 18

The method of Embodiment 17, wherein the precursor composition further comprises a monomeric triallyl isocyanurate, monomeric triallyl cyanurate, or a combination comprising at least one of the foregoing.

Embodiment 19

The method of Embodiment 17 or 18, further comprising emulsion polymerizing poly(triallyl isocyanurate), poly(triallyl cyanurate), or a combination comprising at least one of the foregoing to form polymer particles; and filtering and drying the polymer particles to form a powder.

Embodiment 20

The method of Embodiment 19, further comprising washing the polymer particles with an aqueous base.

Embodiment 21

The method of Embodiment 20, wherein the precursor composition is a thermosetting composition and, after forming the precursor composition into a dielectric layer, at least partially curing the thermosetting composition to provide a prepreg.

The singular forms "a," "an," and "the" as used herein include plural referents unless the context clearly dictates otherwise. "Or" means "and/or." The endpoints of all ranges directed to the same characteristic or component are independently combinable and inclusive of the recited endpoint. As used herein and throughout, "disposed," "contacted," and variants thereof refers to the complete or partial physical contact between the respective materials, substrates, layers, films, and the like. Further, the terms "first," "second," and the like herein do not denote any order, quantity, or importance, but rather are used to distinguish one element from another.

All references are incorporated herein by reference.

While specific embodiments have been shown and described, various modifications and substitutions can be made thereto without departing from the spirit and scope of the invention. Accordingly, it is to be understood that the present invention has been described by way of illustration and not limitation.

What is claimed is:

1. A circuit material, comprising a dielectric layer comprising a polymer component, wherein the polymer component comprises:
   a continuous polymeric matrix; and
   particles comprising a poly(triallyl isocyanurate), a poly(triallyl cyanurate), a copolymer comprising at least one of the foregoing, or a combination comprising at least one of the foregoing, wherein the particles are dispersed in the continuous polymeric matrix; and
   wherein the circuit material has
   a dissipation factor ($D_f$) of less than 0.0060 at 10 GHz, and
   a dielectric constant ($D_k$) of less than 3.8 at 10 GHz.

2. The circuit material of claim 1, wherein the polymer component comprises 10 to 90 weight percent of the continuous polymeric matrix, based on a total weight of the polymer component, and the polymer matrix has a $T_g$ greater than 170° C. and a temperature of decomposition ($T_d$) greater than 350° C.

3. The circuit material of claim 1, wherein the continuous polymeric matrix is formed from a thermosetting resin comprising at least two free-radically reactive functional groups, and that has an LOI of less than 20.

4. The circuit material of claim 1, wherein the polymer component comprises
   1 to 50 weight percent of the polymer particles and
   1 to 50 weight percent of monomeric triallyl isocyanurate, monomeric triallyl cyanurate, or a combination comprising at least one of the foregoing, each based on the total weight of the polymer component.

5. The circuit material of claim 1, wherein the total unit isocyanurate or cyanurate content of the polymer component is at least 12 weight percent, based on the total weight of the thermosetting composition; and wherein the circuit material has a dissipation factor ($D_f$) less than 0.0040 at 10 GHz.

6. The circuit material of claim 1, wherein the particles are emulsion polymerized particles wherein the particles have one or both of a decomposition temperature of greater than 400° C. or a mean particle size of 0.1 to 10 micrometers, determined using dynamic light scattering.

7. The circuit material of claim 1, wherein the continuous polymeric matrix comprises the reaction product of a composition comprising a thermoplastic polymer, a thermosetting resin, or a combination comprising at least one of the foregoing, and monomeric triallyl isocyanurate, monomeric triallyl cyanurate, or a combination comprising at least one of the foregoing.

8. The circuit material of claim 1, wherein the continuous polymeric matrix is a reaction product of a thermosetting resin composition, wherein the circuit material has a dissipation factor ($D_f$) of less than 0.0050 at 10 GHz, and wherein the thermosetting resin composition comprises a vinyl-functional poly(arylene ether), butadiene, isoprene, or a combination comprising at least one of the foregoing, and optionally a crosslinking agent.

9. The circuit material of claim 7, wherein the thermosetting resin composition comprises, based on total weight of the thermosetting composition
10 to 40 weight percent of poly(arylene ether);
5 to 40 weight percent of the monomeric triallyl isocyanurate, monomeric triallyl cyanurate, or a combination comprising at least one of the foregoing; and
1 to 30 weight percent of the polymeric particles of poly(triallyl isocyanurate), poly(triallyl cyanurate), copolymers comprising at least one of the foregoing, or a combination comprising at least one of the foregoing;
wherein the circuit material has a dissipation factor ($D_f$) of less than 0.0050 at 10 GHz.

10. The circuit material of any of claim 7, wherein the continuous polymer matrix comprises a thermoplastic cyclic olefin copolymer, a polytetrafluoroethylene, or a polyethylene.

11. The circuit material of claim 1, wherein the dielectric layer further comprises an inorganic filler.

12. The circuit material of claim 1, wherein the dielectric layer has a thickness of 1 to 1000 micrometers.

13. The circuit material claim 1, wherein the dielectric layer is a prepreg comprising a woven or non-woven, organic or inorganic, fabric reinforcement in an amount of 5 to 40 volume percent, based on the total volume of the dielectric layer.

14. The circuit material of claim 1, further comprising a conductive metal layer disposed on the dielectric layer.

15. The circuit material of claim 14, wherein the conductive metal layer is patterned to form a circuit.

16. A circuit subassembly, comprising
a conductive metal layer; and
a circuit material comprising a dielectric layer comprising a polymer component, wherein the polymer component comprises:
a continuous polymeric matrix; and
particles comprising a poly(triallyl isocyanurate), a poly(triallyl cyanurate), a copolymer comprising at least one of the foregoing, or a combination comprising at least one of the foregoing, wherein the particles are dispersed in the continuous polymeric matrix; and
wherein the circuit material has
a dissipation factor ($D_f$) of less than 0.0060 at 10 GHz, and
a dielectric constant ($D_k$) of less than 3.8 at 10 GHz;
wherein a peel strength between the conductive metal layer and the dielectric layer is greater than 4.0 pounds per inch.

17. A method of making a dielectric layer comprising a polymer component for a circuit material, the method comprising
combining a thermoplastic polymer, a thermosetting resin, or a combination comprising at least one of the foregoing with a plurality of polymer particles comprising poly(triallyl isocyanurate), poly(triallyl cyanurate), a copolymer comprising at least one of the foregoing, or a combination comprising at least one of the foregoing, and having decomposition temperature greater than 400° C., to provide a precursor composition; and
forming the precursor composition into a dielectric layer, wherein the thermoplastic polymer, thermosetting resin or a combination comprising at least one of the foregoing is a continuous polymeric matrix, and wherein the polymer particles are dispersed in the continuous polymeric matrix.

18. The method of claim 17, wherein the precursor composition further comprises a monomeric triallyl isocyanurate, monomeric triallyl cyanurate, or a combination comprising at least one of the foregoing.

19. The method of claim 17, further comprising
emulsion polymerizing poly(triallyl isocyanurate), poly(triallyl cyanurate), or a combination comprising at least one of the foregoing to form polymer particles; and
filtering and drying the polymer particles to form a powder.

20. The method of claim 19, further comprising washing the polymer particles with an aqueous base.

21. The method of claim 20, wherein the precursor composition is a thermosetting composition and, after forming the precursor composition into a dielectric layer, at least partially curing the thermosetting composition to provide a prepreg.

22. The circuit material of claim 1, wherein the circuit material has a dissipation factor ($D_f$) of less than 0.0040 at 10 GHz.

23. The circuit material of claim 1, wherein the circuit material has a dissipation factor ($D_f$) of less than 0.0030 at 10 GHz.

24. The circuit material of claim 1, wherein the dielectric layer further comprises 10 to 70 weight percent of inorganic filler based on the total weight of the dielectric layer.

25. The circuit material of claim 1, wherein the dielectric layer further comprises 15 to 60 weight percent of fused silica filler based on the total weight of the dielectric layer.

* * * * *